US006580905B1

(12) United States Patent
Naidu et al.

(10) Patent No.: US 6,580,905 B1
(45) Date of Patent: *Jun. 17, 2003

(54) SYSTEM AND METHOD FOR CONTROLLING THE LEVEL OF SIGNALS OUTPUT TO TRANSMISSION MEDIA IN A DISTRIBUTED ANTENNA NETWORK

(75) Inventors: Arun Naidu, Raleigh, NC (US); Steven Morelen, Cary, NC (US)

(73) Assignee: Ericsson Inc., Research Triangle Park, NC (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1155 days.

(21) Appl. No.: 08/674,875

(22) Filed: Jul. 2, 1996

(51) Int. Cl.[7] .................................................. H04Q 7/00
(52) U.S. Cl. ................... 455/422; 455/234.1; 455/235.1
(58) Field of Search ................................ 455/422, 423, 455/424, 67.1, 67.5, 690, 70.72, 234.1, 234.2, 235.1, 239.1, 249.1, 253, 254, 281, 282, 283, 289, 291, 507, 517, 524, 560, 561

(56) References Cited

U.S. PATENT DOCUMENTS

| 4,355,304 | A | * | 10/1982 | Kasuga et al. ............... 455/72 |
| 5,321,849 | A | * | 6/1994 | Lemson .................... 455/235.1 |
| 5,493,712 | A | * | 2/1996 | Ramesh et al. .......... 455/234.2 |
| 5,579,374 | A | | 11/1996 | Doi et al. ..................... 379/59 |

FOREIGN PATENT DOCUMENTS

| EP | 0 476 569 | 3/1992 | ............ H04Q/7/04 |
| GB | 2 300 549 | 11/1996 | ............ H04Q/7/30 |
| JP | 0248028 | * 12/1985 | ............... 455/235.1 |
| WO | WO90/06021 | * 5/1990 | ............... 455/239.1 |
| WO | WO91/07037 | 5/1991 | ............ H04L/27/30 |
| WO | WO92/11705 | 7/1992 | ............ H04B/1/38 |
| WO | WO92/13400 | 8/1992 | ............ H04B/7/26 |
| WO | WO92/16059 | 9/1992 | ............ H04B/7/005 |

OTHER PUBLICATIONS

A. Morris, "Cable in PCS: Pioneering Telephony's Future Technology," *Communications Technology*, pp. 42, 45, and 47–49, Dec. 1994.
H.E. Young, "PCS Over Cable—An Opportunity for Some CATV Companies," *Telephony*, pp. 70–72, Jan. 30, 1995.
C.A. Eldering et al., "CATV Return Path Characterization for Reliable Communications," *IEEE Communications Magazine*, pp. 62–69, Aug. 1995.

* cited by examiner

*Primary Examiner*—Thanh Cong Le
(74) *Attorney, Agent, or Firm*—Myers Bigel Sibley & Sajovec

(57) ABSTRACT

A system and method are provided for controlling the gain of signals transported over transmission media in a distributed antenna network. The system includes a plurality of remote antenna units where each remote antenna unit includes a signal level comparator for comparing the level of the signals received by the respective antenna unit with a predetermined reference level, and a gain controller for reducing the gain of the remote antenna unit when the signal level comparator determines that the level of the received signal exceeds said predetermined reference level. The system may accommodate TDMA systems when a gain controller is used that is fast enough to respond within the time slots of the received signals. As a result, the signal levels output from the remote antenna units are prevented from exceeding a maximum signal level.

20 Claims, 5 Drawing Sheets

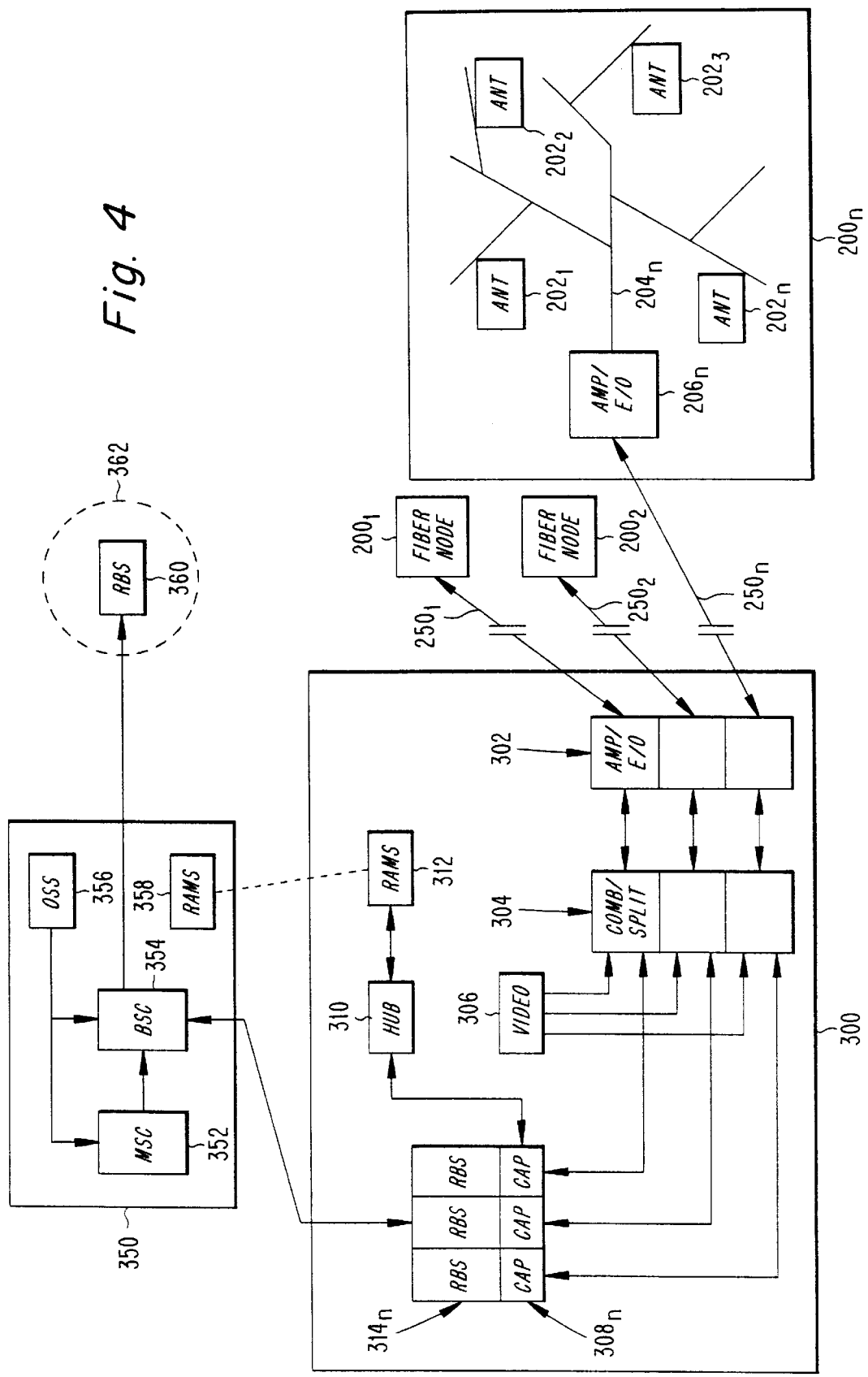

US 6,580,905 B1

SYSTEM AND METHOD FOR CONTROLLING THE LEVEL OF SIGNALS OUTPUT TO TRANSMISSION MEDIA IN A DISTRIBUTED ANTENNA NETWORK

BACKGROUND

The present invention is directed to a system and method for controlling the level of signals output from remote antenna units to transmission media in a distributed antenna network. More particularly, the present invention reduces the gain of a remote antenna unit when its output signal level is determined to be greater than the maximum output level which may be received by the transmission media. Accordingly, received signals that are stronger than the maximum output level may be transmitted across the transmission media without saturating the system.

As personal communication services (PCS) evolve as the next generation of cellular telephone technology, systems and techniques for simply and efficiently transmitting and receiving communication signals are being investigated. One known system is a distributed antenna network (which is also referred to as a multicast network) which provides coverage over substantial areas by a plurality of remote antenna units. An example of a distributed antenna network is illustrated in FIG. 1 where an individual transceiver 10 is connected to a plurality of cells $20_1, \ldots 20_n$ by transmission media 30 which transports radio signals between the transceiver unit 10 and the cells $20_1 \ldots 20_n$. Each of the cells $20_1, \ldots 20_n$ include remote antenna units $21_1, \ldots 21_n$. The remote antenna units $21_1, \ldots 21_n$ may be connected to the transmission media 30 by frequency converting circuitry $22_1, \ldots 22_n$ for certain applications.

Various infrastructures are being developed and modifications of existing infrastructures are of great interest as alternatives for PCS because they are fully capable of providing high quality signals at lower costs than traditional cellular infrastructures. For example, CATV infrastructures have been modified for use in PCS. Such modifications include the CATV infrastructures using a hybrid fiber/coax (HFC) cable infrastructure to increase capacity and improve service quality. Although it is theoretically possible for any CATV infrastructure to support PCS with the proper modifications, the HFC cable infrastructure offers an attractive option as an economical alternative to wireless providers seeking to avoid the high cost of network construction.

FIG. 2 illustrates the basic components of a CATV infrastructure used to support PCS. In FIG. 2, base station equipments $50_1$ and $50_2$ are connected to a public network such as a public switched telephone network. Remote antenna signal processors (RASPs) $52_1$ and $52_2$ connect the base station equipments $50_1$ and $50_2$ to a fiber equipment 54. The fiber equipment 54 is connected to a fiber node 58 by fiber optic cable 56 and the fiber node 58 is connected to remote antenna driver (RAD) nodes $62_1$ and $62_2$ by two-way coaxial cable 60. The RAD nodes $62_1$ and $62_2$ each include a group of RADs $64_1$ and $64_2$ and $66_1$ and $66_2$ respectively connected to antennas $68_1$, $68_2$, $70_1$, and $70_2$. This CATV infrastructure converts radio frequency signals into CATV frequency signals usable in the existing CATV infrastructure and converts CATV frequency signals back into radio frequency signals for broadcast. More specifically, the RASPs $52_1$ and $52_2$ convert the radio frequency signals from the base station equipments $50_1$ and $50_2$ and then send the converted signals in the downlink path toward the appropriate fiber node 58 and onto the coaxial cable 60.

The RADs $64_1$, $64_2$, $66_1$ and $66_2$ are connected to the coaxial cable 60 for converting CATV frequency signals into assigned radio frequency signals. Radio frequency signals may be received by the RADs $64_1$, $64_2$, $66_1$ and $66_2$ which convert these signals into signals of frequencies suitable for transmission in the uplink path of the CATV infrastructure. Thereafter, the RASPs $52_1$ and $52_2$ convert the upstream CATV frequency signals back into radio frequency signals for processing by the base station equipments $50_1$ and $50_2$. This CATV infrastructure also may accommodate equipment for multiple modulation schemes, such as time division multiple access (TDMA), code division multiple access (CDMA) and frequency division multiple access (FDMA).

Radio telephony systems may utilize this CATV infrastructure by operating on available portions of the radio frequency spectrum over fiber optic and coaxial cables which are widely available in urban areas so that such systems may be installed to take advantage of this existing infrastructure. The large installed base of fiber optic and coaxial cables used by CATV operators may thereby be effectively exploited at a minimal cost by this infrastructure which distributes the signals to the appropriate antenna locations. To efficiently provide RF coverage in new cellular and PCS communication systems, it is becoming increasingly common to use distributed antenna systems. In distributed antenna systems, it is often necessary to transmit RF signals covering a wide range of amplitudes across transmission media with a limited and more narrow range of amplitudes for the signals. Conventional automatic gain control (AGC) techniques for controlling the gain are insufficient in allowing the wide range of signals to be fully transmitted over the transmission media of a limited dynamic range. In conventional AGC techniques, even though stronger signals, which exceed the maximum signal level for the transmission media, from sources relatively near the remote antenna units are limited to be below the maximum signal level for transmission across the transmission media, weak signals from sources relatively far away from the remote antenna units are undesirably reduced below the noise floor and effectively cut off. The conventional techniques do not adequately control gain so that strong signals do not saturate the system and weak signals are not unnecessarily reduced below the noise floor.

SUMMARY

One object of the present invention therefore is to provide a system and method for controlling the level of signals transmitted from remote antenna units over transmission media in a distributed antenna network so that signals covering a wide range of amplitudes may be transmitted over transmission media having a more narrow range of amplitudes for transmitting signals.

Another object of the present invention is to provide a system and method for comparing a predetermined reference level with the level of signals received by each remote antenna unit in a distributed antenna network, and controlling the gain of the respective remote antenna units based upon this comparison to prevent strong signals from saturating the system.

According to one embodiment of the present invention, the foregoing and other objects are attained in a system and method for controlling the gain of signals transported over transmission media in a distributed antenna network. The system comprises a plurality of remote antenna units where each remote antenna unit includes a signal level comparator for comparing the level of the signals received by the respective antenna unit with a predetermined reference level, and a gain controller for reducing the gain of the remote antenna unit when the signal level comparator determines that the level of the received signal exceeds said predetermined reference level. As a result, the signal levels output from the remote antenna units are prevented from exceeding a maximum signal level so that strong signals do not saturate the system.

In a further embodiment of the present invention, the predetermined reference level is set to correspond with the maximum level for transmitting signals over the transmission media. Thereby, the level of the signals output over the transmission media are prevented from saturating the system without being unduly restricted.

In a still further embodiment of the present invention, the signal level comparator generates an error signal when the received signal exceeds the predetermined reference level which is used for reducing the gain in proportion to the error signal. The system may accommodate TDMA standards when a gain controller is used that is fast enough to respond within the time slots specified by the standards.

BRIEF DESCRIPTION OF THE DRAWINGS

The invention will be more fully understood by reading this description in conjunction with the accompanying drawings, which are given by way of illustration only, and thus are not limitative of the present invention, wherein:

FIG. 4 is a block diagram showing a system infrastructure in which a gain control system according to an embodiment of the present invention is implemented.

DETAILED DESCRIPTION

This invention is directed to a system and method which controls the gain in a plurality of remote antenna units of a distributed antenna network. Often in distributed antenna networks, signals covering a wide range of amplitudes are attempted to be transported from the remote antenna units across transmission media which are not capable of handling such a wide range of amplitudes. In particular, when a strong signal is received by a remote antenna unit (for instance, when a mobile station is directly under a remote antenna unit), it is desirable to reduce the gain of the remote antenna unit so that the strong signal does not saturate the system. Accordingly, the system and method of the present invention reduce the level of signals produced by remote antenna units when the received signal level exceeds a predetermined reference level.

Figure 1:
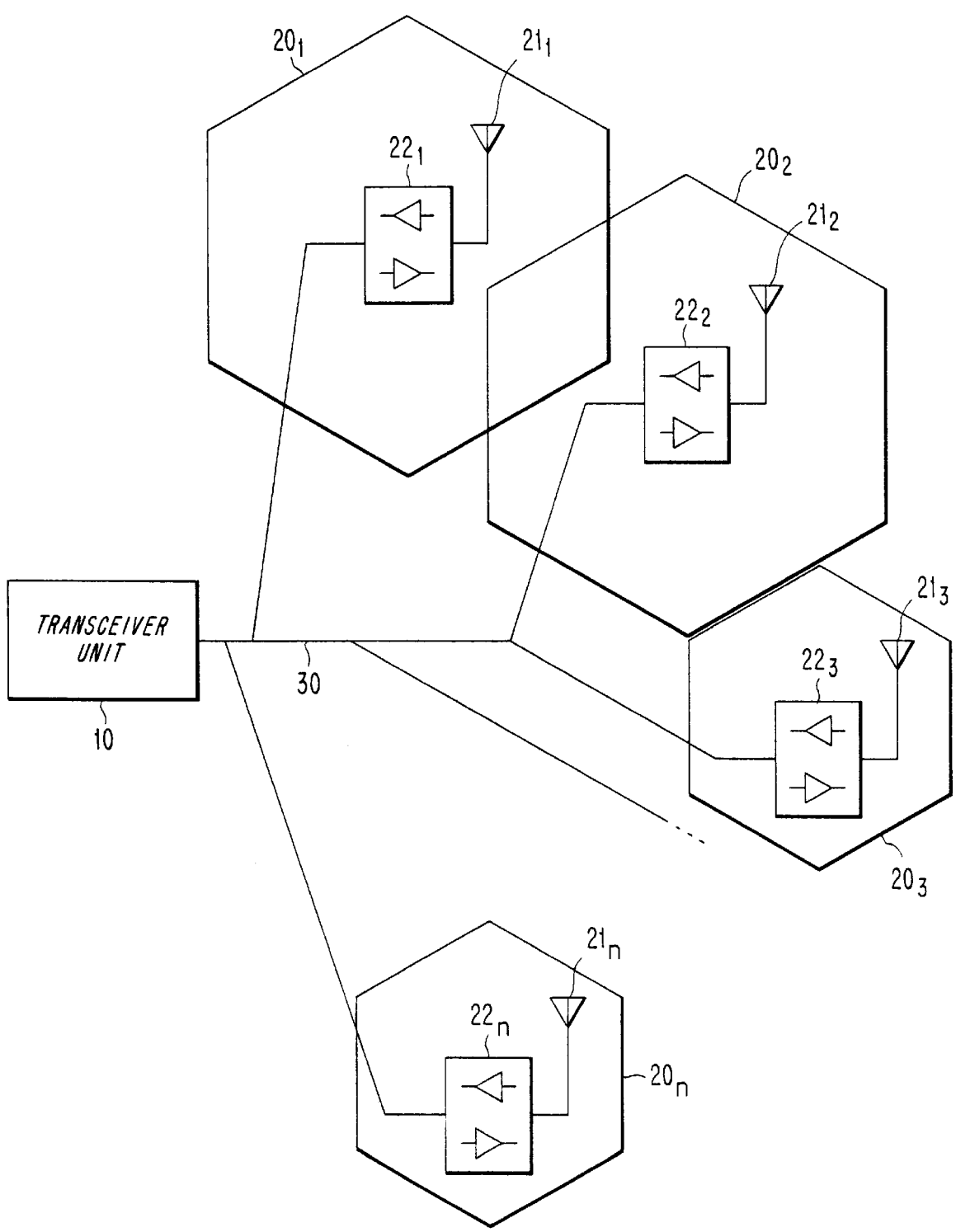
FIG. 1 illustrates a conventional distributed antenna network.
Figure 2:
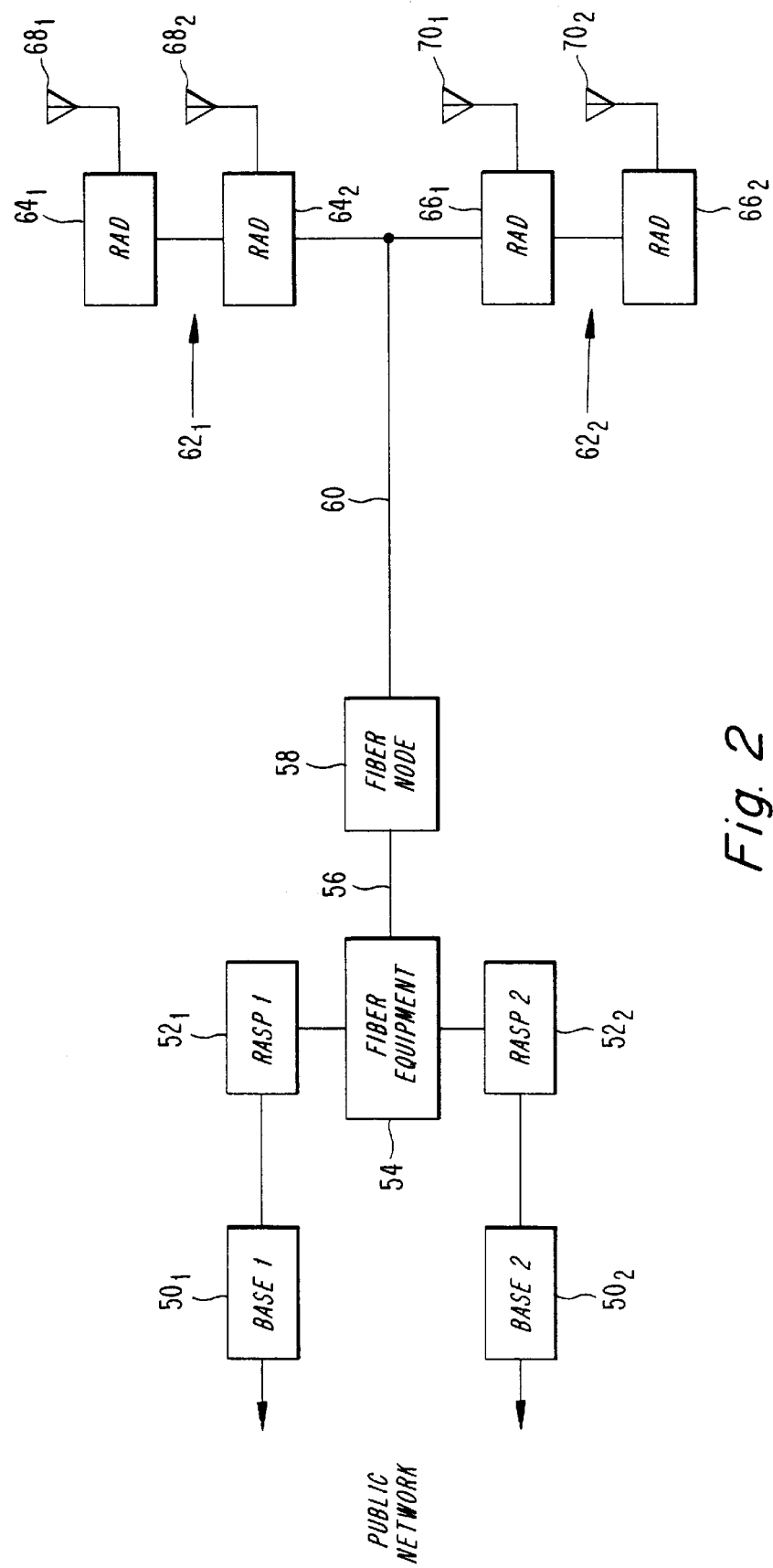
FIG. 2 illustrates a block diagram of a known CATV infrastructure which supports PCS.
Figure 3A:
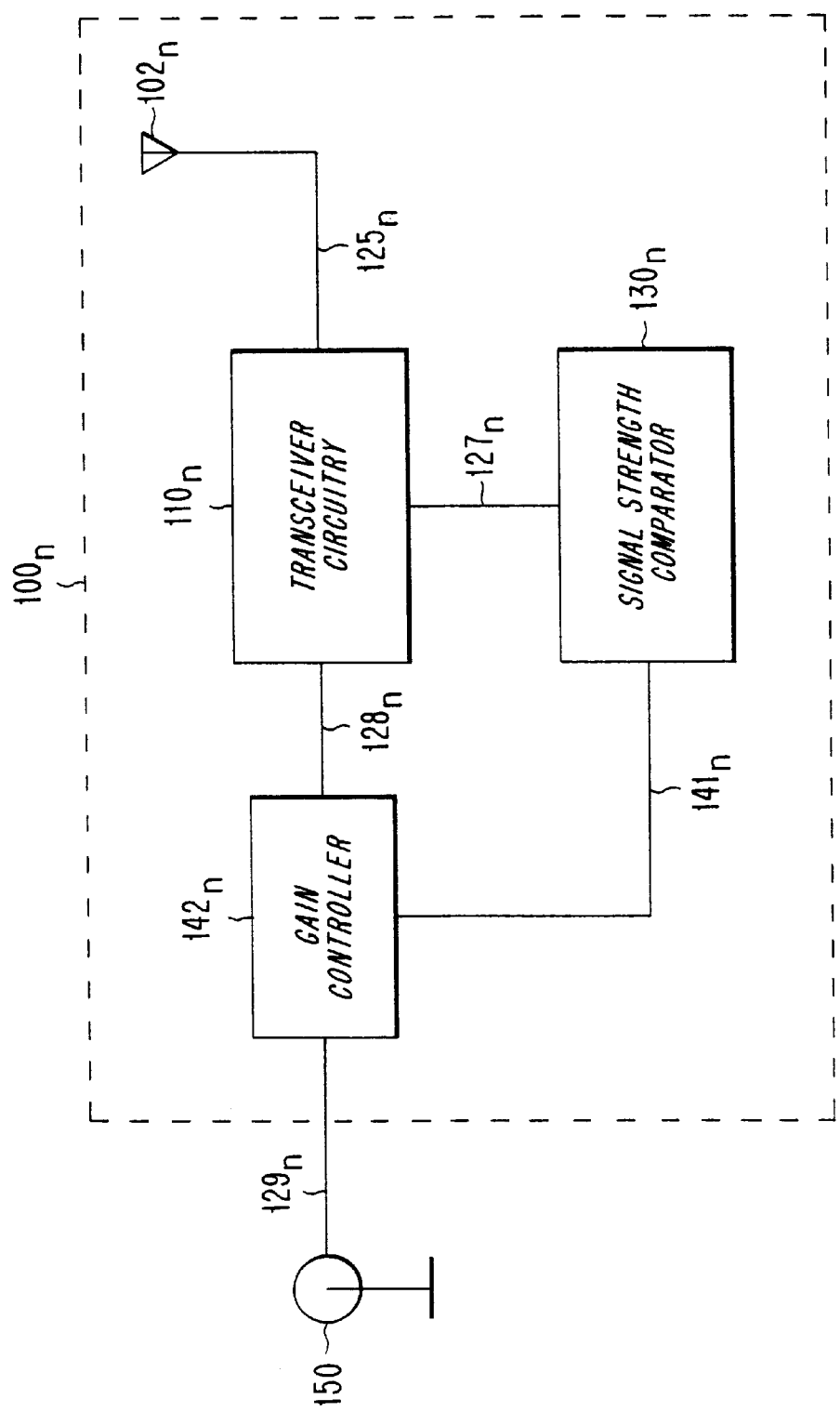
FIGS. 3a and 3b are block diagrams showing embodiments of the system for controlling the gain in a distributed antenna network according to the present invention.

FIG. 3(a) illustrates one example of a system that is used in each remote antenna unit for controlling the gain in a distributed antenna network according to the present invention. In this system, a plurality of remote antenna units $100_n$ are connected to a network output 150 but only a representative remote antenna unit $100_n$ is shown in FIG. 3(a). An antenna $102_n$ provides an RF input signal $125_n$ to transceiver circuitry $110_n$ in this system. The transceiver circuitry $110_n$ is connected to a signal strength comparator $130_n$ which compares a predetermined reference level with a signal $127_n$ which is output from the transceiver circuitry $110_n$ and corresponds to the signal $125_n$ received by the antenna $102_n$. The signal strength processor $130_n$ outputs an error signal $141_n$ when the signal $127_n$ is determined to exceed the predetermined reference level. A gain controller $142_n$ receives the error signal $141_n$ and a signal $128_n$ which is output from the transceiver circuitry $110_n$ and corresponds to the signal $125_n$ received by the antenna $102_n$. The gain controller $142_n$ controls the gain of the remote antenna unit $100_n$ based on the error signal $141_n$ such that the output signal $129_n$ has the proper level.

The signal strength comparator $130_n$ determines whether the level of the signal $129_n$ exceeds the maximum level permitted by the transmission media. Therefore, the predetermined reference level is selected to correspond to the maximum permitted level. Typically, this predetermined reference level is set in each remote antenna unit $100_n$ upon installation to correspond with maximum signal level capable of being transmitted over the transmission media. However, this predetermined reference level may be later modified after installation for use with different transmission media. The signal strength comparator $130_n$ determines whether the signal $127_n$ indicates that the signal $129_n$ exceeds the predetermined reference level; if so, the error signal $141_n$ is generated in proportion to the difference between the signal $127_n$ and the predetermined reference level. The error signal $141_n$ is input to the gain controller $142_n$ and the level of signal $128_n$ is reduced in proportion to the level of the error signal $141_n$. As a result, the signal $129_n$ output to the network across the transmission media is prevented from saturating the system.

Figure 3B:
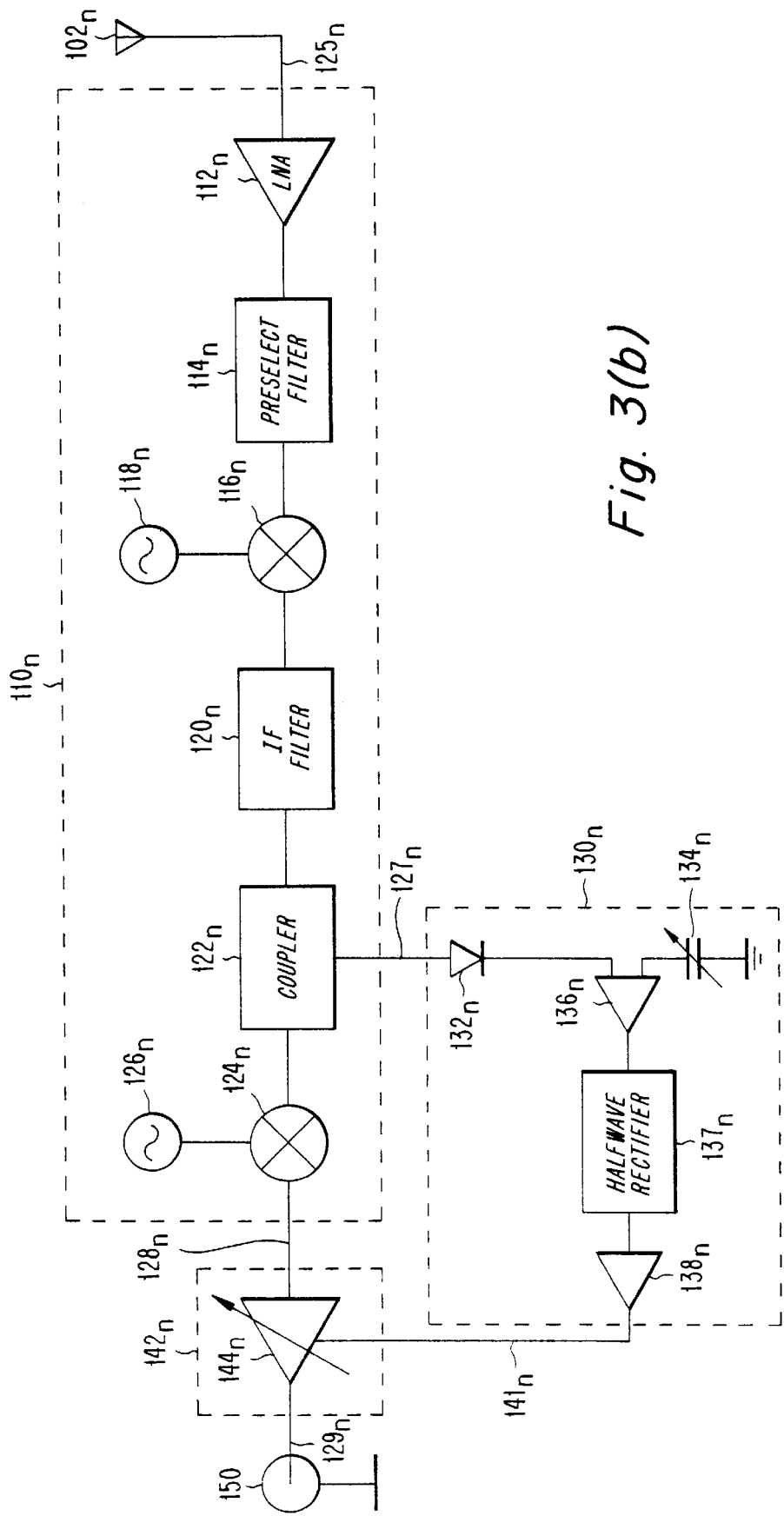

FIG. 3(b) illustrates in more detail components that may be preferably used in the block diagram of FIG. 3(a). The transceiver circuitry $110_n$ includes a low noise amplifier $112_n$ connected to the antenna $102_n$ for amplifying RF signals $125_n$ generated by the antenna $102_n$. The amplified signal is further processed by a preselecting filter $114_n$, a mixer $116_n$ connected to a first local oscillator $118_n$, and an intermediate frequency filter $120_n$. A standard coupler $122_n$ sends a portion of this processed signal $127_n$ to the signal strength comparator $130_n$ and a portion to a mixer $124_n$. The mixer $124_n$ is connected to a second local oscillator $126_n$ and outputs signal $128_n$ to the gain controller $142_n$.

The signal strength comparator $130_n$ includes a diode $132_n$ for converting the signal $127_n$ to a DC level for comparison with the predetermined reference level. A reference level generator $134_n$ is used for generating the predetermined reference level. The reference level generator $134_n$ is set based on the transmission media as described above. A differential amplifier $136_n$ compares the output of the diode $132_n$ with the signal output by the reference level generator $134_n$. The comparison output of the differential amplifier $136_n$ is further processed by a half wave rectifier $137_n$ and a scale and offset amplifier $138_n$ for outputting the error signal $141_n$. The half wave rectifier $137_n$ and the scale and offset amplifier $138_n$ process the signal output from the differential amplifier $136_n$ so that the gain controller $142_n$ may reduce the signal $129_n$ to a level below the maximum permitted output level of the transmission media. It will be appreciated that modifications and other circuitry may be used for generating the error signal $141_n$ which controls the gain controller $142_n$.

The gain controller $142_n$ includes a variable gain amplifier $144_n$. This variable gain amplifier $144_n$ controls the level of the signal $129_n$ in response to the error signal $141_n$. By choosing the variable gain amplifier $144_n$ to be sufficiently fast, the present system may be used in TDMA applications. For example, an analog device AD603 integrated circuit may be used for the variable gain amplifier $144_n$ so that the gain of the amplifier responds to the error signal $141_n$ within the time slots of TDMA standards.

FIG. 4 illustrates an example of a CATV system infrastructure that may advantageously utilize Applicants' system and method for equalizing delay. The infrastructure includes fiber nodes $200_1, \ldots 200_n$ which are connected to a CATV head-end 300 by respective optical fibers $250_1, \ldots 250_n$. The CATV head-end 300 may support a number of fiber nodes $200_1, \ldots 200_n$, each of which may generally support approximately 500 to 1500 homes or subscribers through a plurality of remote antenna units $202_1, \ldots 202_n$. The remote antenna units $202_1, \ldots 202_n$ are respectively connected by the optical fibers $250_1, \ldots 250_n$ to the CATV head-end 300. Also, a plurality of the remote antenna units $202_1, \ldots 202_n$ are connected to an amplifying and optical/electrical converting circuit $206_n$ by coaxial cabling $204_n$.

The CATV head-end 300 includes an amplifying and electrical/optical converting circuit 302 which is used for interfacing the CATV head-end 300 to the optical fibers $250_1, \ldots 250_n$. The amplifying and electrical/optical converting circuit 302 is connected to combining and splitting circuitry 304 which is connected to a video source 306 and cable access processing (CAP) units $308_1, \ldots 308_n$ which at least correspond in number to the fiber nodes $200_1, \ldots 200_n$ in the system. The CAP units $308_1, \ldots 308_n$ are connected to radio base stations (RBS) $314_1, \ldots 314_n$ and a hub 310. The hub 310 is further connected to a remote antenna management system (RAMS) 312. The CAP units $308_1, \ldots 308_n$ are also connected to an operation support system/switching center (OSS/SC) 350. The OSS/SC 350 includes a mobile switching center 352, a base station controller 354, an operation support system 356 and its own RAMS 358. The RAMS 358 of the OSS/SC 350 may communicate with the RAMS 312 of the CATV head-end 300 so that a plurality of CATV head-ends may be controlled at a central location. The base station controller is also connected to a macrocell 360 which includes a (RBS) 362. The CAP units $308_1, \ldots 308_n$ provide the frequency conversion and power level adjustments for placing telephony carrier signals on the CATV infrastructure as well as controlling and monitoring the status of the remote antenna units $202_1, \ldots 202_n$.

The remote antenna units $202_1, \ldots 202_n$ are located in desired areas and convert the CATV base communication signals back to their proper air frequencies and power levels. Each of the remote antenna units $202_1, \ldots 202_n$ is associated with a specific transceiver radio unit (TRU) in the RBS $314_1, \ldots 314_n$ so that the CATV network is totally transparent to the radio operation. The operating frequencies of the CAP units $308_1, \ldots 308_n$ are set to exactly match the operating frequencies of the remote antenna transmitters. Up to six TRUs in a specific one of the RBS $314_1, \ldots 314_n$ feed a single one of the CAP units $308_1, \ldots 308_n$ which in turn serves several fiber nodes $200_1, \ldots 200_n$ in the CATV network. A combiner within the CAP units $308_1, \ldots 308_n$ provide six transmit input ports from the RBS $314_1, \ldots 314_n$ in order to support a maximum of six TRUs. The CAP units $308_1, \ldots 308_n$ convert the telephony carrier signals to CATV frequency signals and feed them to the CATV head-end 300 over a bi-directional coaxial cable.

In the CATV head-end 300, the telephony carrier signals are combined with the video signals and both signals are transmitted over the fiber optic cables $250_1, \ldots 250_n$ to fiber nodes $200_1, \ldots 200_n$. At the fiber nodes $200_1, \ldots 200_n$, the signals are converted back to electrical signals and distributed over a tree and branch coaxial network. Each individual one of the remote antenna units $201_1, \ldots 202_n$ taps off the coaxial cabling $204_n$, filters the carrier signals, converts the frequency and transmits the carrier signals over the air interface. The video signals continue unaltered to each CATV subscriber. For the uplink, the remote antenna units $202_1, \ldots 202_n$ receive two diversity signals from the air, downconvert the frequency, and transmit the different frequency diversity carrier signals over the CATV infrastructure. In the CATV infrastructure at the fiber nodes $200_1, \ldots 200_n$, the electrical signals are converted to optical signals and transmitted back to the CATV head-end 300. These signals are then converted back to electrical signals and routed to the CAP units $308_1, \ldots 308_n$ over the bi-directional cable. The CAP units $308_1, \ldots 308_n$ convert the uplink carrier signals back up to frequencies for input to the TRUs. The CAP units $308_1, \ldots 308_n$ receive digital control information from the RAMS 312 and forward remote antenna control information to the desired one of the remote antenna units $202_1, \ldots 202_n$.

The invention being thus described, it will be obvious that the same may be varied in many ways. Such variations are not to be regarded as a departure from the spirit and scope of the invention, which is determined by the following claims. All such modifications as would be obvious to one skilled in the art are intended to be included within the scope of the following claims.

What is claimed is:

1. A system for controlling the gain of signals transported over transmission media in a distributed antenna network, comprising:

a plurality of remote antenna units, each of said remote antenna units including:

a signal level comparator for comparing a received signal level of a signal received by the remote antenna unit with a predetermined reference level and generating a single gain control signal, and a gain controller for adjusting the gain of the remote antenna unit based on the single gain control signal generated by its associated signal level comparator.

2. A system according to claim 1, wherein said predetermined reference level corresponds to the maximum level for transmitting signals over the transmission media.

3. A system according to claim 1, wherein said signal level comparator generates the single gain control signal when the received signal level exceeds said predetermined reference level.

4. A system according to claim 3, wherein said gain controller reduces the gain in the proportion to said single gain control signal.

5. A system according to claim 4, wherein said gain controller comprises a fast variable amplifier for operating within time slots for TDMA standards.

6. The system of claim 1, wherein the distributed antenna network includes a CATV network.

7. A method for controlling the gain of signals transported over transmission media in a distributed antenna network, comprising the steps of:

(a) comparing a received signal level of a signal received by one of a plurality of remote antenna units with a predetermined reference level, the comparison being performed by a signal level comparator located in the one remote antenna unit and being represented by a single gain control signal; and (b) adjusting the gain of the one remote antenna unit based on the single gain control signal generated by the signal level comparator associated with the one remote antenna unit.

8. A method according to claim 7, wherein said predetermined reference level corresponds to the maximum level for transmitting signals over the transmission media.

9. A method according to claim 7, wherein the single gain control signal is generated when the received signal level is determined to exceed said predetermined reference level.

10. A method according to claim 9, wherein the gain is reduced in proportion to said single gain control signal.

11. A method according to claim 10, wherein said step (b) reduces the gain by fast variable amplifier which operates within time slots for TDMA standards.

12. The method of claim 7, wherein the step of adjusting is performed by a gain controller located in the one remote antenna unit.

13. The method of claim 7, wherein the distributed antenna network includes a CATV network.

14. A communication system, comprising:

a plurality of remote antenna units, each remote antenna unit including a signal level comparator for comparing a received signal level of a signal received at its associated antenna unit to a predetermined threshold level and generating a single gain control signal based on the comparison, and including a gain controller for adjusting the gain of its associated antenna unit based on the single gain control signal; and control means for receiving signals received and adjusted by each of the remote antenna units, and providing the received signals to intended destinations.

15. The communication system of claim 14, wherein the control means includes a CATV headend.

16. The communication system of claim 14, wherein the predetermined reference level corresponds to a maximum level for transmitting signals through the system.

17. The communication system of claim 14, wherein the single gain control signal indicates that the received signal level exceeds the predetermined threshold level.

18. The communication system of claim 14, wherein the gain controller adjusts the gain in proportion to the single gain control signal.

19. The communication system of claim 18, wherein the gain controller reduces the gain of its associated remote antenna unit based on the single gain control signal.

20. The communication system of claim 17, wherein each gain controller includes a fast variable amplifier for operating within TDMA time slots according to TDMA standards.

* * * * *